United States Patent [19]
Schwartz

[11] Patent Number: 5,969,559
[45] Date of Patent: Oct. 19, 1999

[54] METHOD AND APPARATUS FOR USING A POWER GRID FOR CLOCK DISTRIBUTION IN SEMICONDUCTOR INTEGRATED CIRCUITS

[76] Inventor: David M. Schwartz, 21 Madera Ave., San Carlos, Calif. 94070

[21] Appl. No.: 08/871,316

[22] Filed: Jun. 9, 1997

[51] Int. Cl.[6] .................................................... H03K 1/04
[52] U.S. Cl. .......................... 327/295; 327/293; 327/548
[58] Field of Search ............................. 327/51, 52, 291, 327/295–297, 530, 547, 548, 293

[56] References Cited

U.S. PATENT DOCUMENTS

| | | | |
|---|---|---|---|
| 4,496,850 | 1/1985 | Takemae et al. | 365/233 |
| 4,521,893 | 6/1985 | Bellman | 331/60 |
| 4,912,553 | 3/1990 | Pal et al. | 348/8 |
| 5,120,989 | 6/1992 | Johnson et al. | 327/114 |
| 5,223,826 | 6/1993 | Amou et al. | 340/825.06 |
| 5,278,524 | 1/1994 | Mullen | 361/792 |
| 5,388,249 | 2/1995 | Hotta et al. | 395/553 |
| 5,424,709 | 6/1995 | Tal | 340/310.01 |
| 5,448,192 | 9/1995 | Van De Wiel | 327/141 |
| 5,477,180 | 12/1995 | Chen | 327/175 |
| 5,517,532 | 5/1996 | Reymond | 375/354 |
| 5,521,541 | 5/1996 | Okamura | 327/297 |
| 5,537,498 | 7/1996 | Bausman et al. | 327/293 |
| 5,565,816 | 10/1996 | Coteus | 331/2 |
| 5,586,307 | 12/1996 | Wong et al. | 395/551 |

OTHER PUBLICATIONS

IBM Technical Disclosure Bulletin, "Unique Wiring of a Very–High–Speed Clock", vol. 32, No. 4B, Sep. 1989.
IBM Technical Disclosure Bulletin, "Fault–Tolerant Synchronized Clock Distribution for a Distributed Power", vol. 32, No. 4B, Sep. 1989.

K.W. Current et al., May 1996, "Low–Energy Logic Circuit Techniques for Multiple Valued Logic," *Proceedings 1996 26th International Symposium on Multiple–Valued Logic Cat. No. 96CB35950*:pp. 86–90.

Dragan Maksimović and Vojin G. Oklobdžija, Jun. 1995, "Integrated Power Clock Generators for Low Energy Logic," *PESC 95 Record; 26th Annual IEEE Power Electronics Conference (Cat. No. 95CH35818)*:pp. 61–67.

*Primary Examiner*—Kenneth B. Wells
*Attorney, Agent, or Firm*—Pennie & Edmonds LLP

[57] ABSTRACT

A method and apparatus for distributing clock signals in an integrated circuit is disclosed. In a preferred embodiment, the power grid of the integrated circuit is used to distribute a periodic timing signal, in addition to the power supply voltage, to local areas of the integrated circuit, the local areas having circuitry for extracting a local clock signal from the periodic timing signal. Instead of simply carrying a DC power supply signal, the power grid is provided with a waveform constituting the sum of the DC power supply signal and the periodic signal, and the power grid then supplies all areas of the integrated circuit with this waveform. Local circuits then tap the power grid as needed to extract the periodic signal, from which local clock signals are then generated. In another preferred embodiment, a periodic timing signal is provided in the form of electromagnetic radiation to local areas of the integrated circuit by means of an optical or radio frequency transmitter. Associated with each local area of the integrated circuit is an optical or radio frequency receiver for receiving the periodic timing signal, along with conversion circuitry for extracting a local clock signal from the periodic signal.

17 Claims, 9 Drawing Sheets

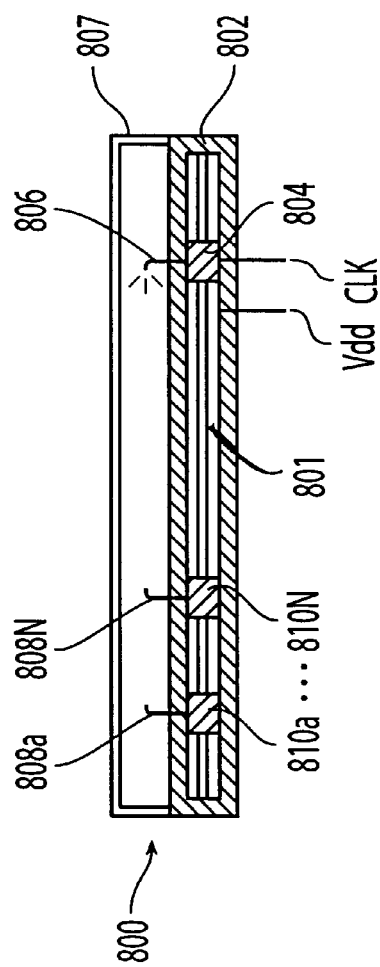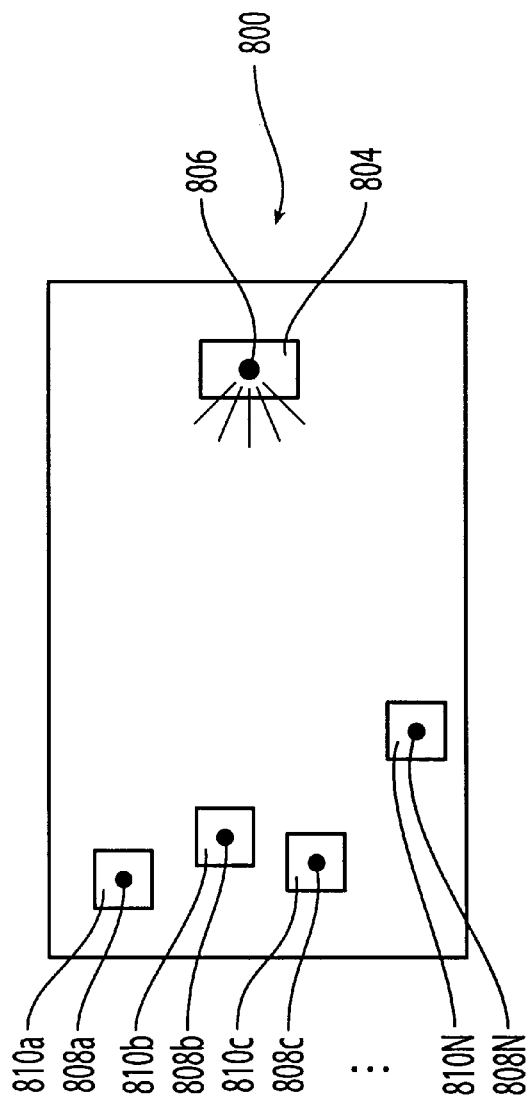

METHOD AND APPARATUS FOR USING A POWER GRID FOR CLOCK DISTRIBUTION IN SEMICONDUCTOR INTEGRATED CIRCUITS

FIELD OF THE INVENTION

The present invention relates to the field of integrated circuit architecture and layout. In particular, the present invention relates to the generation and distribution of clock signals in high-speed, high-density integrated circuits.

BACKGROUND OF THE INVENTION

Integrated circuits having synchronous or clocked circuit elements operate based on the timing of clock signals which provide a reference point or activation signal for circuit activity and processing. The clock signal also provides a timing reference which different circuits adopt when stepping through their respective processing tasks. Especially for microprocessor integrated circuits, it is important that clock signals provided to different areas of the chip be in synchronization with each other, such that processing and execution by circuit components are accomplished in synchronization. It is vital to the operation of a microprocessor that the system clock be supplied uniformly to all circuit components of the microprocessor with minimal clock skew. Each circuit component should receive the same clock signal, in synchronization, with all other circuit components.

As is known in the art, clock signal synchronization may be characterized in terms of clock delay and clock skew. Clock delay refers to the timing delay of a clock signal within a circuit relative to the system clock. Clock skew, on the other hand, refers to the variations between clock delays associated with various points of a circuit. While it may be physically impossible to totally eliminate clock delay, it is possible to match this delay across the entire integrated circuit and thus eliminate clock skew to various circuit components. To this extent, two points within an integrated circuit may have equal clock delays, but no clock skew between them. It is desirable to match clock delays for all circuit components and thus minimize or eliminate clock skew within an integrated circuit.

As integrated circuit devices such as microprocessors use faster and faster clock speeds while also increasing in circuit size and density, variations in the structure and topology of the integrated circuit may introduce delay or error factors within the conductive lines that carry the clock signal. Although previously insignificant at lower clock speeds, resistances and capacitances between points along a clock distribution line introduce RC skews which are significant at the higher clock speeds. For example, a skew of 1.0 nanosecond may have been acceptable for 25 MHz microprocessors, as this skew was only 2.5% of the 40 ns clock period. However, as microprocessors increase in clock speed to 250 MHz and beyond, a 1.0 nanosecond skew would represent 25% of the clock period, which is very unacceptable. It is desirable to keep clock skew below a very small percentage, preferably below 10 percent, of the clock period of a microprocessor.

Several prior art methods have been implemented to provide components of an integrated circuit with minimum skew clock signals. Several methods are described in U.S. Pat. No. 5,586,307 entitled "Method and Apparatus for Supplying Synchronous Clock Signals to Circuit Components," the disclosure of which is hereby incorporated by reference. Other methods are disclosed in "The New Line in IC Design," *IEEE Spectrum Magazine* (March 1997), the contents of which are hereby incorporated by reference.

FIG. 1 shows one representative prior art method for distributing clock signals in an integrated circuit device. Shown in FIG. 1 is an integrated circuit device 100 comprising several circuit components 102, 104, 106, and 108, each circuit component having at least one synchronous circuit element requiring a clock signal. Integrated circuit device 100 further comprises several current drivers 110a–110d which each receive the same clock signal input provided by means not shown in FIG. 1. Integrated circuit device 100 further comprises clock distribution lines 112, 114, 116, and 118 coupled between the current drivers 110a–110d and circuit components 102–108 as shown in FIG. 1. Importantly, the clock distribution lines 112, 114, 116, and 118 are designed to have the same width and overall length, so that their RC delays are close to each other. In this manner, clock skew is minimized. Since the circuit components 102–108 are located at different straight-line distances from the clock generators, the clock distribution lines 112, 114, and 118 are doubled back in some areas to maintain the constant line length. For example, clock distribution line 112 has a few double-back running lines so that it will be equal in length to clock distribution line 116. Clock distribution line 116 has no doubling-back and therefore determines the length of all the other clock distribution lines.

The clock distribution scheme of FIG. 1 has several disadvantages. First, the clock distribution lines take up a large amount of valuable area ("real estate") on the integrated circuit chip. Second, the large number of current drivers such as elements 110a–110d in FIG. 1 involve large amounts of power and circuit complexity. Third, uncontrollable differences in the manufacture of the clock distribution lines in the processing stages of the integrated circuit will affect the thickness of the dielectric of these lines up to 20 percent, thus affecting the capacitance of these lines and thus their RC time constants, contributing to topological mismatch. Fourth, variations in line width due to manufacturing tolerances and other factors introduce unpredictable variations in the resistance of these lines and thus their RC time constants, also contributing to topological mismatch. These problems are exacerbated in high density, high-speed integrated circuits as larger degrees of crosstalk, signal reflections, capacitive coupling, and other side effects raise the noise floor and affect the timing and detection of the provided clock signals.

Generally speaking, to compensate for the above factors, more rigorous design verification is employed, as well as disproportionate increases in die area dedicated to clock signals, power, and ground. Indeed, as reported in "The New Line in IC Design," supra, the disproportion of clock circuitry to other portions of the integrated circuit has reached the point where some modern integrated circuits spend as much as 40 percent of their power dissipation on clock circuitry alone.

It is an object of the present invention to provide a uniformly distributed, low-skew clock signal to all of the components of an integrated circuit regardless of topology and processing variations throughout the integrated circuit device.

It is a further object of the present invention to provide a low-skew clock signal using clock distribution circuitry occupying a reduced portion of the integrated circuit area.

It is a further object of the present invention to provide a low-skew clock signal using clock distribution circuitry which demands a smaller proportion of the total power used by the integrated circuit device, for lowering the noise floor and enabling greater transistor densities.

SUMMARY OF THE INVENTION

These and other objects of the present invention are provided for by a clock distribution scheme which uses the power grid of an integrated circuit to distribute a periodic signal to local areas of the integrated circuit, the local areas having circuitry for extracting a local clock signal from the periodic signal. Instead of simply carrying a DC power supply signal, the power grid is provided with a waveform constituting the sum of the DC power supply signal and the periodic signal, and the power grid then supplies all areas of the integrated circuit with this waveform. Local circuits then tap the power grid as needed to extract the periodic signal, from which local clock signals are then generated.

Advantageously, the power grid of a typical integrated circuit inherently includes a large conductive area for providing a low resistance path between a power supply node and various portions of the integrated circuit. The power grid accordingly has a very high bandwidth and can easily carry a very high frequency periodic signal to different areas of the integrated circuit chip with very small relative phase shift. Accordingly, the local clock signals derived from the periodic signal have extremely small skew in relation to each other.

An integrated circuit according to a preferred embodiment comprises a plurality of circuit components, each circuit component having at least one synchronous circuit element. The integrated circuit further comprises a clock node for receiving a periodic signal and a power grid for distributing a power supply voltage to the plurality of circuit components. The power grid is also used for distributing the periodic signal to the plurality of circuit components for use in providing a clock signal to each of the synchronous circuit elements. In one preferred embodiment the periodic signal is carried by a positive power rail conductor of the power grid, while in another preferred embodiment the periodic signal is carried by a ground plane conductor.

In another preferred embodiment, the periodic signal has a frequency equal to an operating frequency of the integrated circuit. In a separate preferred embodiment, the periodic signal has a frequency equal to an integer fraction of an operating frequency of the integrated circuit, the local circuit components having frequency multiplier circuitry for generating a local clock signal at the operating frequency of the integrated circuit.

In another preferred embodiment, the integrated circuit comprises a power input node for receiving the power supply voltage and a voltage adder for adding the periodic waveform to the power supply voltage. The power supply voltage is generally equal to the sum of a nominal power supply voltage and a power supply noise signal, the power supply noise signal having an amplitude less than a first percentage of said nominal power supply voltage. In a preferred embodiment, the periodic signal has an amplitude which is sufficiently greater than the amplitude of the power supply noise signal, such that the periodic signal can be reliably extracted from the power grid by local circuits.

In another preferred embodiment, a periodic waveform is provided to local areas of the integrated circuit by means of an optical or radio frequency transmitter positioned near the clock node. Associated with each local area of the integrated circuit is an optical or radio frequency receiver for receiving the periodic waveform, and conversion circuitry for deriving a local clock signal from the periodic signal. In this manner, clock skew among different local circuits of the integrated circuit is minimized or eliminated. In another preferred embodiment, a single transmitter may distribute an electromagnetic timing signal from a first integrated circuit chip to a plurality of other integrated circuit chips on a multi-chip module, for allowing synchronous operation of the various integrated circuit chips with minimal clock skew.

BRIEF DESCRIPTION OF THE DRAWINGS

FIG. 8a shows a side view of an integrated circuit chip having a clock distribution scheme according to another preferred embodiment;

FIG. 8b shows a top view of the integrated circuit chip of FIG. 8a;

DETAILED DESCRIPTION OF THE INVENTION

Figure 1:
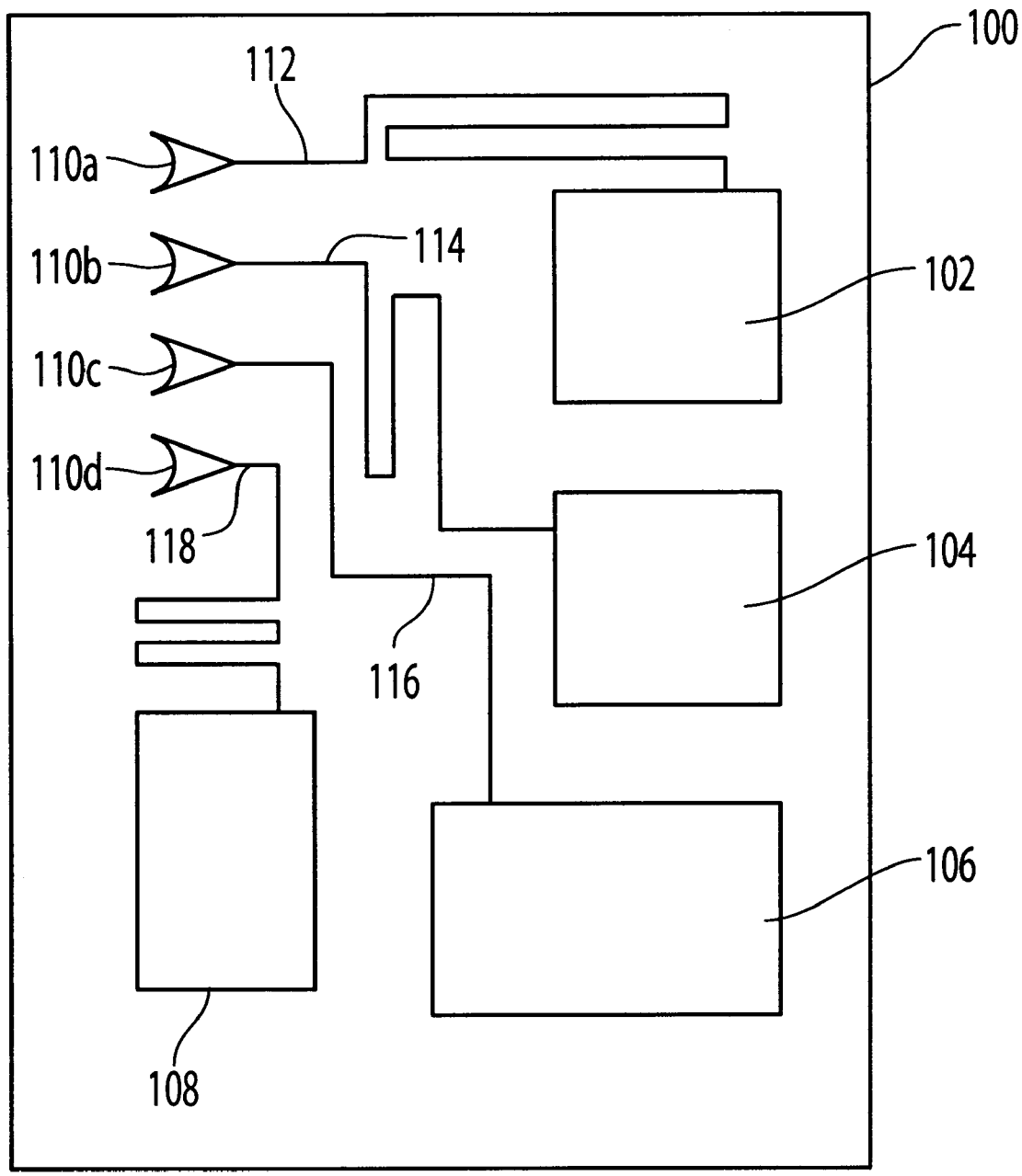
FIG. 1 shows an integrated circuit having a clock distribution scheme according to the prior art.
Figure 2:
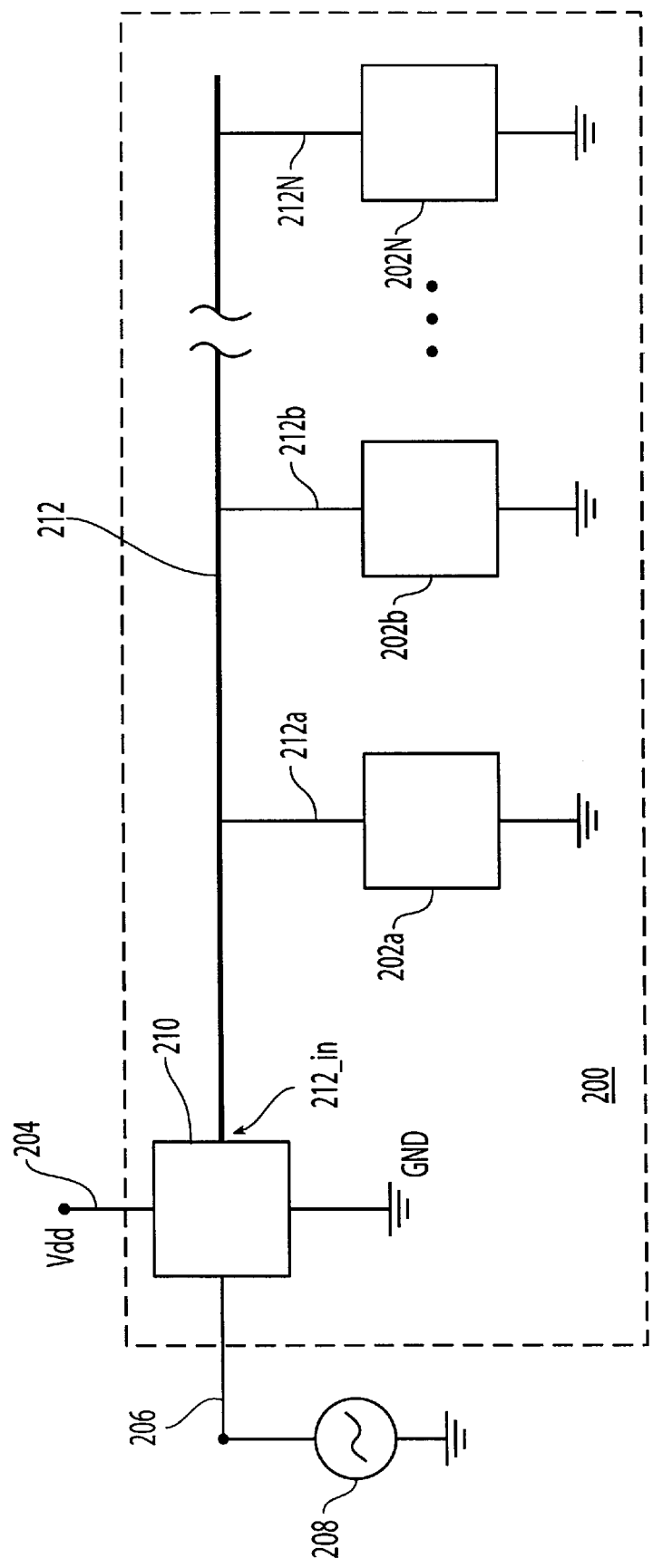
FIG. 2 shows a diagram of an integrated circuit having a clock distribution scheme according to a preferred embodiment.

FIG. 2 shows a diagram of an integrated circuit 200 having a clock distribution scheme according to a preferred embodiment. Integrated circuit 200 comprises circuit components 202a, 202b, . . . , 202N which perform various logical functions according to the overall functionality of the integrated circuit 200. By way of nonlimiting example, where the integrated circuit 200 is a microprocessor, the circuit component 202a may contain an integer execution unit or a small portion of an integer execution unit, while circuit component 202b may contain an on-chip cache or small portion thereof. Generally, there may be hundreds or thousands of circuit components such as circuit components 202a and 202b of the integrated circuit 200, which are placed at different regions of the integrated circuit chip and which require synchronized clock signals.

Integrated circuit 200 further comprises a power supply node 204 for receiving a DC power supply signal Vdd from an external power supply not shown. Although Vdd may be any of a variety of constant DC voltage levels, a typical value of +5.0 volts is used for purposes of the present disclosure. Integrated circuit 200 further comprises a clock node 206 for receiving a periodic signal from a signal generator 208. While element 208 is shown in FIG. 2 as being external to the integrated circuit 200, it may alternatively be located on-board the integrated circuit 200 as well. Generally, the periodic signal at clock node 206 can have any of a variety of shapes, although in a preferred embodiment the periodic signal is half-wave rectified sinusoid with a frequency equal to an operating frequency of the integrated circuit 200. A sinusoidally-shaped signal advantageously lacks the harmonics associated with non-sinusoidal signals which may cause relatively greater distortion of the non-sinusoidal signals due to circuit nonlinearities.

In accordance with a preferred embodiment, the periodic signal supplied to clock node 206 has an amplitude which is appreciably greater than the nominal noise level of the DC signal provided to power supply node 204, while also being significantly less than the DC power supply voltage itself. Thus, for example, where the 5.0 volt DC signal provided to the power supply node 204 is accompanied by a noise signal of 3 percent or 0.15 volts, the periodic signal provided to clock node 206 may have an amplitude of approximately 1.0 volts, which is equal to 20 percent of the DC power supply voltage.

Integrated circuit 200 further comprises a voltage adder circuit 210 for adding the voltage at clock node 206 to the power supply voltage at node 204 and for providing the resultant voltage to a conductor 212. In the embodiment of FIG. 2, the conductor 212 is a positive power rail conductor corresponding to the integrated circuit 200, and normally comprises a very large conductive surface having a very low resistance between any two points thereon.

For illustrative purposes, several exemplary points on the conductor 212 are pointed to in FIG. 2, and are labelled as 212_in, 212a, 212b, and 212N. The point 212_in represents a point on conductor 212 which is very near to an output of the voltage adder circuit 210, while the point 212a represents a point on the conductor 212 which is very near to the circuit component 202a, the point 212b represents a point on conductor 212 near circuit component 202b, and so on. Importantly, the conductor 212 has a very low resistance between point 212_in and any of the points 212a, 212b, etc., and has a very small propagation delay between these points relative to the operating period of the integrated circuit. Letting the circuit component 202N represent the farthest circuit component from node 212_in, and letting $t_N$ represent the maximum propagation delay between points 212_in and 212N, a value for $t_N$ in a microprocessor integrated circuit according to the preferred embodiment is less than 100 picoseconds, assuming the microprocessor to have a physical dimension of less than 2 cm on a side.

It is to be appreciated that the positive power rail conductor of most of today's integrated circuits already has a very large conductive surface area and a very high bandwidth. Nevertheless, this large bandwidth remains unused in those prior art circuits which use this conductor solely for distribution of the DC power supply voltage. Advantageously, in accordance with a preferred embodiment, the large bandwidth of the power grid is harnessed to assist in solving a clock distribution problem associated with integrated circuits of ever-increasing speed, size, and density.

Figure 3:
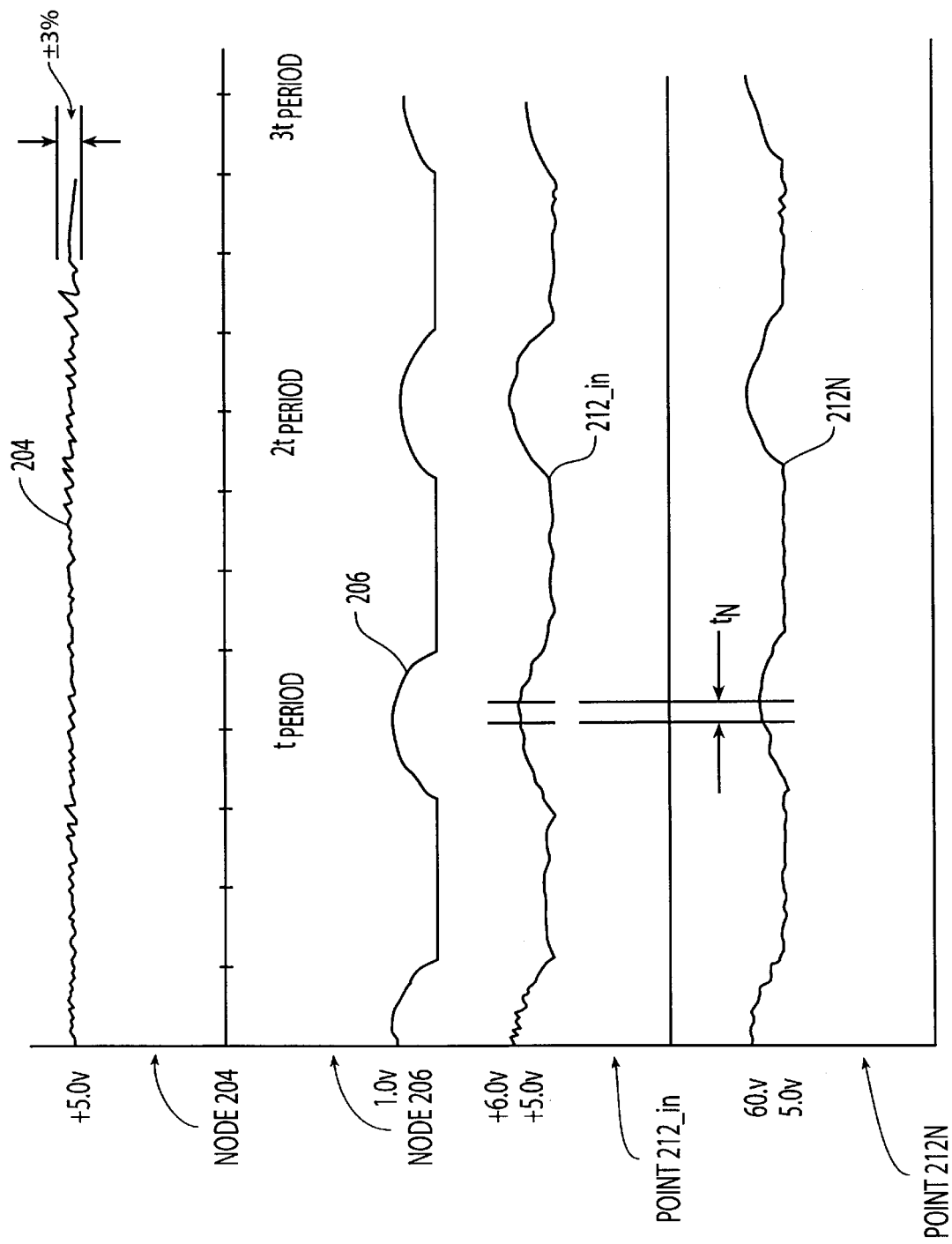
FIG. 3 shows waveforms associated with the integrated circuit of FIG. 2.

FIG. 3 shows waveforms associated with the integrated circuit 200 of FIG. 2. In particular, FIG. 3 shows the power supply signal provided at power supply node 204, the periodic signal provided at clock node 206, and the signals at points 212_in and 212N of the conductor 212. Three periods of the periodic signal, which has a period of $t_{PERIOD}$, are shown in FIG. 3. As shown in FIG. 3, the waveform at power supply node 204 is a 5.0 volt DC waveform which has approximately a 3 percent noise level. At clock node 206, a rectified sinusoid having an amplitude of 1.0 volts is shown. At node 212_in, the output of adder circuit 210, the resultant waveform represents the sum of the signals at nodes 204 and 206, respectively, and thus is a rectified sinusoid riding on a "carrier" of +5.0 volts DC. Finally, at point 212N, a waveform is shown which is substantially identical to the waveform at point 212_in, except that it is delayed by the small amount $t_N$ identified above. It is to be appreciated that delay amount $t_N$ is exaggerated in FIG. 3 and is actually a very small percent, typically less than 2.5 percent, of the period $t_{PERIOD}$.

In accordance with a preferred embodiment, the signals at points 212a, 212b, . . . , 212N are used by the circuit components 202a, 202b, . . . , 202N to generate local clock signals for use by these circuit components. Because the maximum delay of the periodic signal between the farthest point 212N and the point 212_in is $t_N$, the maximum skew exhibited by the local clock signals will not exceed $t_N/t_{PERIOD}$.

Figure 4:
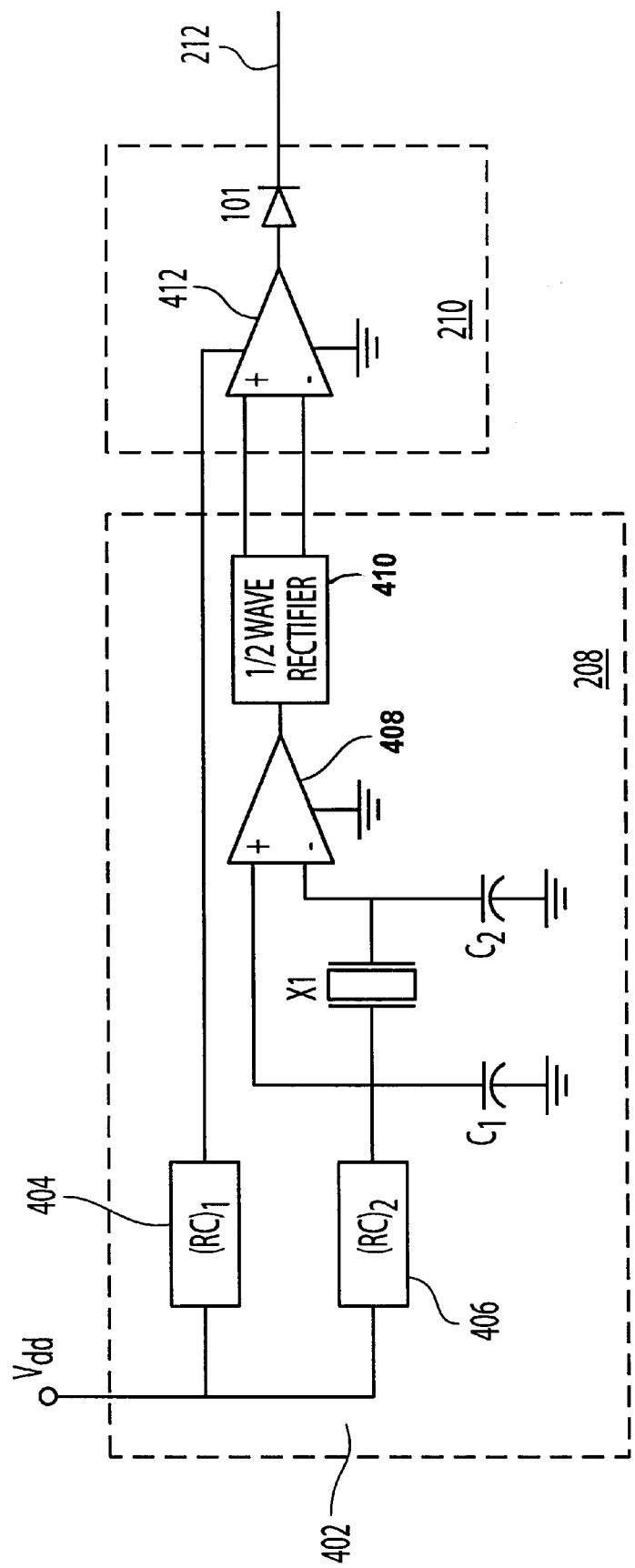
FIG. 4 shows a circuit diagram of a signal generator and voltage adder used in the integrated circuit of FIG. 2.

FIG. 4 shows a more detailed circuit diagram of the signal generator 208 and the voltage adder 210. FIG. 4 is a simplified diagram included for clarity of disclosure, it being appreciated that a person of ordinary skill in the art may readily design similar or alternative circuits having similar functionalities to signal generator 208 and voltage adder 210. Signal generator 208 comprises a power node 402 for receiving a power supply voltage Vdd, and further comprises a first lowpass filter 404 and a second lowpass filter 406 for providing smoothed power to the remainder of the circuit. Signal generator 208 further comprises capacitors C1 and C2, oscillating crystal X1, and operational amplifier circuit 408 coupled as shown in FIG. 4 for producing an approximately 1.0 volt sinusoidal waveform at an output of operational amplifier circuit 408. Finally, signal generator 208 comprises a half-wave rectifier 410 coupled as shown in FIG. 4 for providing a half-wave rectified sinusoidal waveform to voltage adder circuit 210.

Voltage adder circuit 210 comprises an operational amplifier circuit 412 coupled to Vdd, ground, and to the output of signal generator circuit 208 as shown in FIG. 4. Operational amplifier circuit 412 has an output coupled to the anode of a diode D1, the cathode of diode D1 being coupled to the conductor 212 for distribution to the circuit components 202a, 202b, . . . , 202N.

Figure 5:
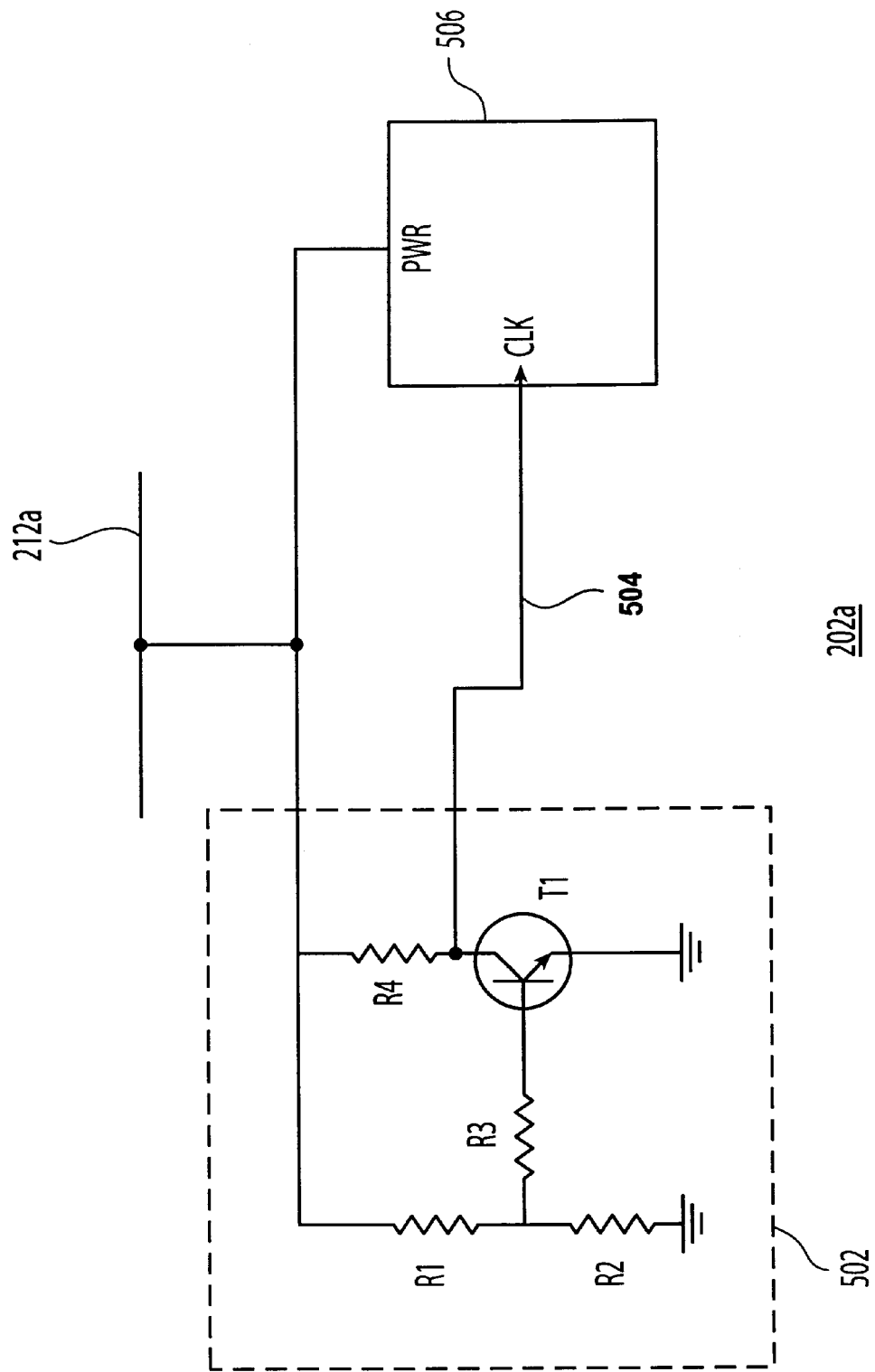
FIG. 5 shows a circuit diagram of a local circuit component used in the integrated circuit of FIG. 2.

FIG. 5 shows a more detailed diagram of circuit component 202a. Circuit component 202a comprises a clock extraction circuit 502 coupled to the conductor 212 which carries the sum of the periodic waveform and the DC power supply signal discussed above. Circuit component 202a further comprises a local clock bus 504 and a functional circuit block 506 comprising synchronous circuit elements requiring a clock signal for operation. It is to be appreciated that the circuit components 202b, 202c, . . . , 202N have clock extraction circuits that are substantially similar to that of circuit component 202a of FIG. 5, but their functional circuit blocks may have widely varying functionalities.

Extraction circuit 502 comprises a first input coupled to the conductor 212 at the point 212a, a voltage divider circuit comprising resistors R1, R2, and R3, a transistor T1, and a pullup resistor R4 coupled as shown in FIG. 5. The voltage divider circuit formed by resistors R1, R2, and R3 has an output coupled to a base of transistor T1, which has a collector coupled to the local clock bus 504 and an emitter coupled to ground. The voltage divider circuit formed by transistors R1, R2, and R3 is designed such that the transistor T1 will switch states when the voltage at point 212a is at a predetermined point $V_{212,thresh}$ lying between the minimum and maximum values of the voltage at point 212 (e.g. between 5.0 volts and 6.0 volts in the circuit of FIG. 5). For example, where the transistor T1 has a threshold voltage $V_T=3.3$ volts, and where $V_{212,thresh}$ is assigned a typical value of 5.707 volts (selected to provide a 25% duty cycle for the local clock signal at node 504), the voltage divider circuit formed by transistors R1, R2, and R3 is designed to provide a voltage at the base of transistor T1 which is 3.3/5.707 or 58 percent of the voltage at node 212a.

Generally, the transistor T1 is a transistor which has a threshold or cut-in voltage $V_T$ which is less than that of a typical transistor used in functional circuit block 506. Thus, while the cut-in voltage of a typical transistor used in functional circuit block 506 is 4.0 volts, the cut-in voltage $V_T$ of transistor T1 may be 3.3 volts.

Figure 6:
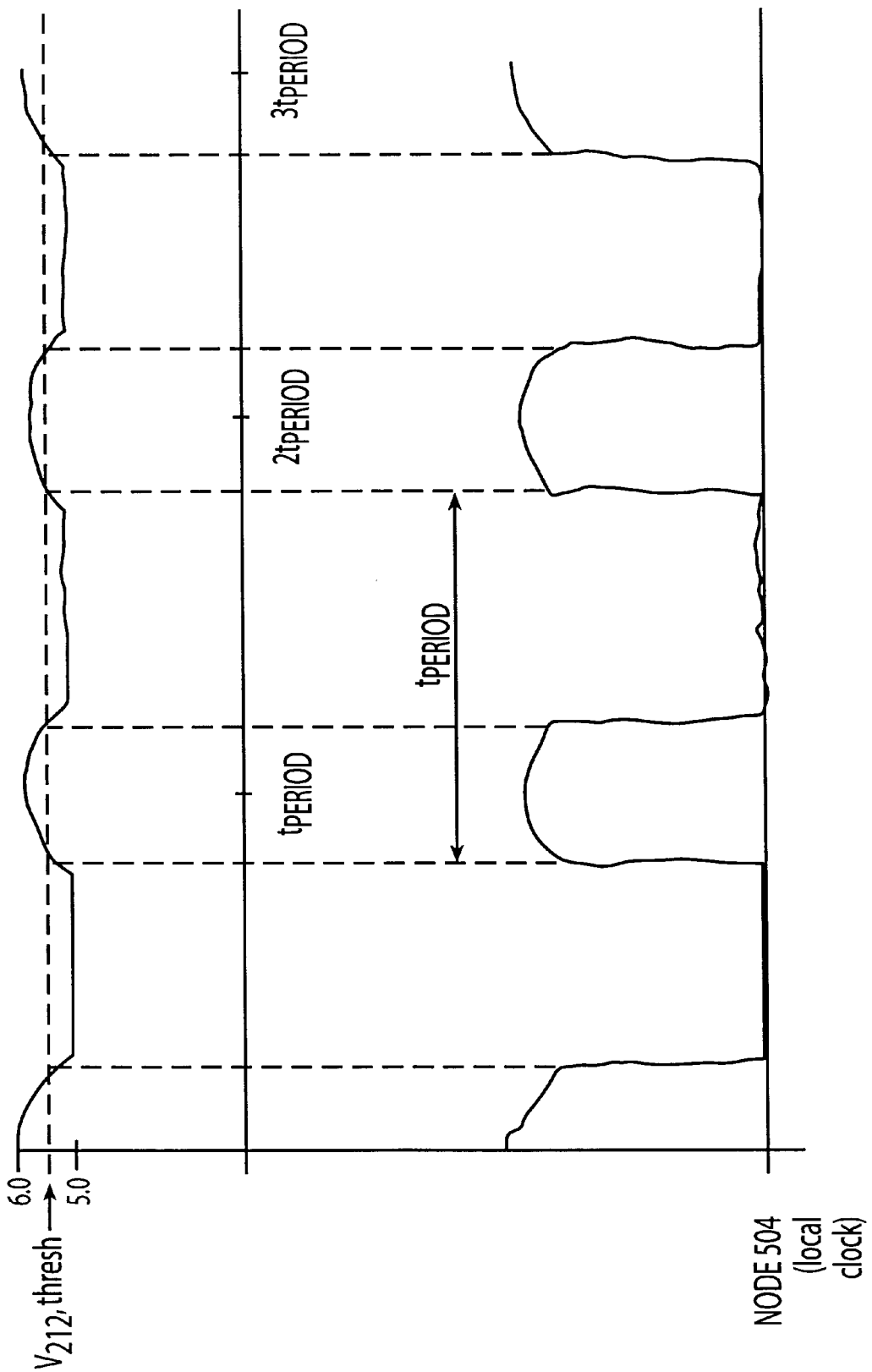
FIG. 6 shows waveforms corresponding to an extraction circuit shown in FIG. 5.

FIG. 6 shows waveforms corresponding to the extraction circuit 502 of FIG. 5. In particular, FIG. 6 shows the waveforms at point 212a and at local clock bus node 504. As desired, the local clock bus 504 is provided with a "reconstituted" clock signal with sharp edges and with a period of $t_{PERIOD}$. Because the cut-in voltages of the transistors T1 of the different circuit components 202a, 202b, . . . , 202N are substantially identical, the clock skew between any two local clock signals will be less than $t_N$, as desired. As indicated above, the duty cycle of the local clock signal may be adjusted by varying the voltage divider circuit resistors R1, R2, and R3. It is to be appreciated that several alternative extraction circuits may be readily apparent to a person of skill in the art upon reading this disclosure, for reliably extracting synchronized local clock signals from conductor 212.

Figure 7:
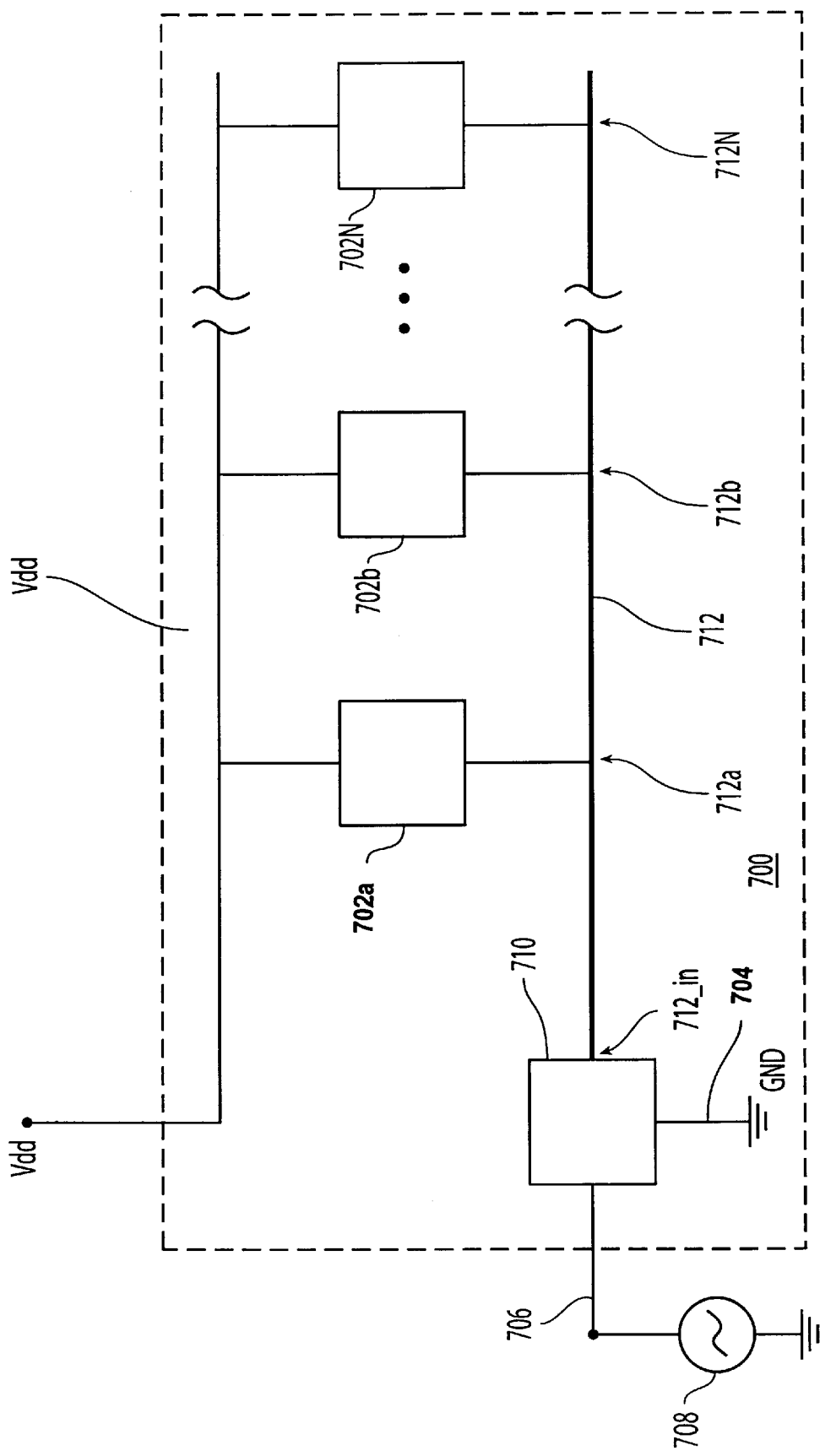
FIG. 7 shows a diagram of an integrated circuit having a clock distribution scheme according to another preferred embodiment.

FIG. 7 shows a diagram of an integrated circuit 700 having a clock distribution scheme according to another preferred embodiment. Integrated circuit 700 comprises circuit components 702a, 702b, . . . , 702N which perform various logical functions in a manner similar to the circuit components 202a, 202b, . . . , 202N of the integrated circuit 200 of FIG. 2. However, instead of providing a periodic signal on the positive power rail conductor as in FIG. 2, the integrated circuit 700 adds the periodic signal to the ground rail GND, providing the sum of GND and the periodic signal onto a pseudoground node 712. The elements 706, 708, and 710 are substantially similar to the elements 206, 208, and 210 of FIG. 2, respectively, with the exception that they are adapted for the GND voltage instead of the positive power rail voltage Vdd. Given the present disclosure, a person of skill in the art may readily adapt aspects of the integrated circuit 200 of FIG. 2 for the pseudoground implementation of FIG. 7.

FIG. 8a shows a side view of an integrated circuit chip package 800 having a clock distribution scheme according to another preferred embodiment. FIG. 8b shows a top view of the integrated circuit chip package 800. Integrated circuit chip package 800 comprises a casing 802 for protecting and supporting circuitry contained within an integrated circuit chip 801. As shown in FIGS. 8a and 8b, integrated circuit chip 801 comprises a CLK node for receiving a clock signal from an external or internal source, a conversion circuit 804 for generating an electromagnetic signal corresponding to the clock signal, and a transmitter 806 rising above the top of the casing 802 for transmitting the electromagnetic signal to other parts of the integrated circuit chip. Integrated circuit chip 801 further comprises a plurality of receivers 808a, 808b, . . . 808N for receiving the external electromagnetic signal. Finally, integrated circuit chip 801 further comprises a plurality of circuit components 810a, 810b, . . . 810N which comprise synchronous circuit elements requiring a clock signal. Each of the circuit components 810a, 810b, . . . 810N comprise demodulator circuitry capable of extracting a local signal from the received electromagnetic signal.

As shown in FIG. 8a, the transmitter 806 and receivers 808a, 808b, . . . , 808N rise above the plane of the integrated circuit chip 801 into a closed cavity formed under a metallic cover 807, which is positioned on top of casing 802. In this manner, the electromagnetic signal radiated by transmitter 806 is effectively transmitted to the receivers 808a, 808b, . . . , 808N while being maintained within the closed cavity formed under metallic cover 807. In this way, electromagnetic noise and interference is reduced among different integrated circuits placed in close proximity to each other. The casing 807 is generally comprised of an aluminum alloy, although other conductive materials such as titanium alloys may be used.

Because the electromagnetic signal travels at the speed of light to the various portions of the chip, the local clock signals generated on the integrated circuit chip 800 exhibit minimized clock skew. In one preferred embodiment, the electromagnetic signal is a radio frequency ("RF") signal, with the transmitter 806 comprising an RF antenna and associated circuitry, and with the receiver/demodulator circuits 808a, 808b, . . . , 808N comprising RF receiver antennae and associated circuitry. In another preferred embodiment, the electromagnetic signal is an optical signal, with the transmitter 806 comprising an optical transmitter such as a laser diode, and with the receiver/demodulator circuits 808a, 808b, . . . , 808N comprising optical receivers.

Figure 9:
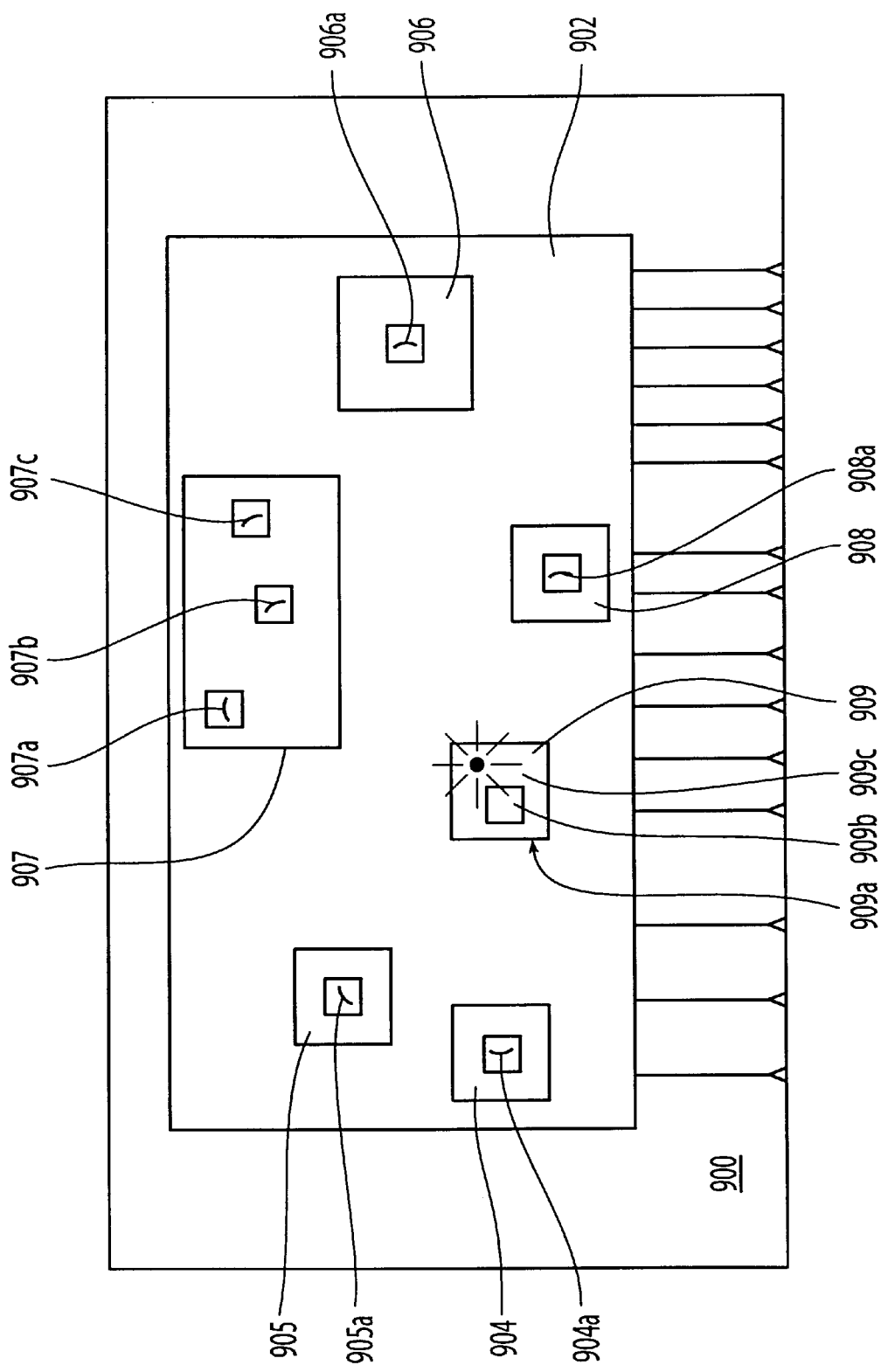
FIG. 9 shows a diagram of a multi-chip module having a clock distribution scheme according to another preferred embodiment.

FIG. 9 shows a diagram of an multi-chip module ("MCM") 900 having a clock distribution scheme according to another preferred embodiment. MCMs according to the prior art generally comprise multiple discrete integrated circuit chips embedded upon a common substrate, usually ceramic in composition. Because of large distances among circuit components distributed over the various integrated circuit chips, the integrated circuit chips run on independent clock signals and communicate asynchronously.

According to a preferred embodiment, MCM 900 comprises a common substrate 902 on which are mounted a plurality of integrated circuit chips 904, 905, 906, 907, and 908. The integrated circuit chips 904, 905, 906, 907, and 908 are capable of running on a common clock by receiving a common electromagnetic signal from a common electromagnetic radiation source, and are capable of generating local clock signals from this signal which are thereby synchronized with each other with minimum clock skew. To achieve this, MCM 900 comprises an integrated circuit chip 909 having a CLK node 909a for receiving a clock signal from an external or internal source, a conversion circuit 909b for generating an electromagnetic signal corresponding to the clock signal, and a transmitter 909c rising above the surface of the integrated circuit chip 909 for transmitting the electromagnetic signal to other parts of the MCM 900.

MCM 900 further comprises a plurality of receiver/demodulators 904a, 905a, 906a, 907a, and 908a contained on each of the integrated circuit chips 904, 905, 906, 907, and 908, respectively, for receiving the electromagnetic signal from transmitter 909c and converting that signal to local clock signals. It is to be appreciated that a given one of the integrated circuit chips may contain more than one electromagnetic receiver if that chip is large enough to require multiple local clocks. For example, the integrated circuit chip 907 in FIG. 9 comprises additional receivers 907b and 907c to generate additional local clock signals on the integrated circuit chip 907. Additionally, the integrated circuit chip 909 may itself have a receiver/demodulator for ensuring minimum clock skew on the integrated circuit chip 909 itself.

Again because the electromagnetic signal travels at the speed of light to the various portions of the MCM 900, the local clock signals generated on the MCM 900 exhibit minimized clock skew. In one preferred embodiment, the electromagnetic signal is an RF signal, with the transmitter 909c comprising an RF antenna and associated circuitry, and with the receiver/demodulator circuits 904a, 905a, 906a, 907a–c, and 908a comprising RF receiver antennae and associated circuitry. In another preferred embodiment, the electromagnetic signal is an optical signal, with the transmitter 909c comprising an optical transmitter such as a laser diode, and with the receiver/demodulator circuits 904a, 905a, 906a, 907a–c, and 908a comprising optical receivers.

It is to be appreciated that the skew minimization provided by the preferred embodiments are best achieved for clock frequencies and relative component distances which fit within the following design constraints. These constraints are dictated by the relative propagation delay time from the power-plus-signal source point 212a (FIG. 2) or 712a (FIG. 7), or from the signal source point 806 (FIG. 8) or 909c (FIG. 9), to the various points at which the signals are received and demodulated. More particularly, the maximum clock skew will be determined by the difference between the maximum propagation delay time $t_{max}$ and the minimum propagation delay time $t_{min}$ according to equation (1) below:

$$\text{skew\_max} = [(t_{max} - t_{min})/t_{PERIOD}] \times 100\% \quad (1)$$

The value for $t_{max}$ is determined by the distance between the most distant receiver point and the transmitter location, denoted $d_{max}$, and the propagation velocity $V_{PROPAGATION}$ of the signal in the medium used. The value for $t_{min}$ is determined by the distance between the nearest receiver point and the transmitter location, denoted $d_{min}$, and the propagation velocity $V_{PROPAGATION}$ of the signal in the medium used. The value for $v_{PROPAGATION}$ in the devices of FIGS. 8 and 9 is the speed of light ($3 \times 10^{10}$ cm/s), while the value for $V_{PROPAGATION}$ in the devices of FIGS. 2 and 7 will be slightly less. For simplicity, the value of $3 \times 10^{10}$ cm/s will be used for $V_{PROPAGATION}$ in the design rule which follows.

Using the relation $t_{PERIOD} = (1/f)$, where f is the operating frequency, and using the relations $t_{max} = (d_{max}/V_{PROPAGATION})$ and $t_{min} = (d_{min}/V_{PROPAGATION})$, equation (1) can be recast into equation (2), where the distances $d_{max}$ and $d_{min}$ are in units of centimeters and the operating frequency f is in units of Megahertz:

$$\text{skew\_max} = [f(d_{max} - d_{min})/30000] \times 100\% \quad (2)$$

Equation (2) can be recast into the following design rule represented by equation (3), where skew_max is in percentage units:

$$d_{max} - d_{min} \leq 300(\text{skew\_max})/f \quad (3)$$

Once again, in equation (3), the units of $d_{max}$ and $d_{min}$ are centimeters, the units of f are Megahertz, and skew_max is in percentage units. The MCM or integrated circuit in question should be designed according to equation (3) to ensure the minimum skew advantages of the preferred embodiment. That is, $d_{max}-d_{min}$, which represents the largest difference in distances between the transmitter point and the respective receiver points, should be kept below the value specified in equation (3).

For convenience and appreciation of the advantages of the preferred embodiment, listed below in Table 1 are values for $(d_{max}-d_{min})$ for different operating frequencies necessary to keep the clock skew below 10 percent and 3 percent, respectively.

TABLE 1

LARGEST RELATIVE DISTANCE VERSUS OPERATING FREQUENCY FOR ACHIEVING <=10% CLOCK SKEW AND <=3% CLOCK SKEW

| f (MHz) | 10 PERCENT $d_{max} - d_{min}$ (cm) | 3 PERCENT $d_{max} - d_{min}$ (cm) |
|---|---|---|
| 10 | 300 | 90 |
| 100 | 30 | 9 |
| 250 | 12 | 3.6 |
| 500 | 6 | 1.8 |
| 1000 | 3 | 0.9 |
| 2000 | 1.5 | 0.6 |
| 3000 | 1 | 0.3 |

Generally, for single-chip circuits, the value of $d_{max}-d_{min}$ dictates the overall size of the chip. However, for the MCM 900, the overall MCM may be larger as long as $d_{max}-d_{min}$ is kept below the values of Table 1. This may be achieved in larger sized MCMs by placing the electromagnetic transmitter near the center of the MCM and placing all integrated circuit chips within a radius of $d_{max}-d_{min}$ from the electromagnetic transmitter.

While preferred embodiments have been described, these descriptions are merely illustrative and are not intended to limit the scope of the present invention. For example, although the preferred embodiment of FIG. 9 was presented in the context of ceramic-substrate multi-chip modules (such as the MCM structure of the Pentium II™), those skilled in the art will recognize that the disclosed methods and structures are readily adaptable for broader applications such as for standard multi-chip printed circuit board layout design. Thus, the specific embodiments described here and above are given by way of example only and the invention is limited only by the terms of the appended claims.

What is claimed is:

1. An integrated circuit, comprising:
 a plurality of circuit components, each circuit component having at least one synchronous circuit element; and
 a power grid for distributing a power supply voltage to said plurality of circuit components;
 wherein said power grid is also used for distributing a periodic signal to said plurality of circuit components for use in providing a clock signal to each of said synchronous circuit elements.

2. An integrated circuit, comprising:
 a plurality of circuit components, each circuit component having at least one synchronous circuit element; and
 a power grid for distributing a power supply voltage to said plurality of circuit components;
 wherein said power grid is also used for distributing a periodic signal to said plurality of circuit components for use in providing a clock signal to each of said synchronous circuit elements, and wherein said plurality of circuit components are provided with a signal proportional to the sum of said power supply voltage and said periodic signal.

3. The integrated circuit of claim 2, said periodic signal having a frequency equal to an operating frequency of said integrated circuit.

4. The integrated circuit of claim 2, said periodic signal having a frequency equal to an integer fraction of an operating frequency of said integrated circuit.

5. An integrated circuit, comprising:
 a plurality of circuit components, each circuit component having at least one synchronous circuit element;

a power grid for distributing a power supply voltage to said plurality of circuit components;

wherein said power grid is also used for distributing a periodic signal to said plurality of circuit components for use in providing a clock signal to each of said synchronous circuit elements;

a power input node for receiving said power supply voltage;

a clock node for receiving said periodic signal; and a voltage adder circuit comprising:
 a first input coupled to said power input node;
 a second input coupled to said clock node; and
 an output coupled to said power grid;

wherein said power grid is supplied with a voltage proportional to a sum of said power supply voltage and said periodic signal for distribution to said plurality of circuit components.

6. The integrated circuit of claim 5, said plurality of circuit components further comprising:

a local clock bus for providing a local clock signal to said at least one synchronous circuit element;

a local clock generation circuit coupled between said power grid and said local clock bus for deriving said local clock signal from said sum of said power supply voltage and said periodic signal.

7. The integrated circuit of claim 6, wherein said power supply voltage is equal to a positive power rail voltage Vdd.

8. The integrated circuit of claim 6, wherein said power supply voltage is equal to a negative power rail voltage −Vdd.

9. The integrated circuit of claim 6, wherein said power supply voltage is equal to a ground voltage GND.

10. The integrated circuit of claim 6, said power supply voltage being equal to the sum of a nominal power supply voltage and a power supply noise signal, said power supply noise signal having an amplitude less than a first percentage of said nominal power supply voltage, wherein said periodic signal has an amplitude greater than a second percentage of said nominal power supply voltage, said second percentage being greater than said first percentage for allowing reliable generation of said local clock signals.

11. The integrated circuit of claim 10, said local clock generation circuit comprising at least one transistor having a threshold voltage, said threshold voltage being greater than the amplitude of said power supply noise signal and less than the amplitude of said periodic signal.

12. An apparatus for providing clock signals to a plurality of local circuits in an integrated circuit, comprising:

means for receiving a periodic signal;

means for receiving a power supply voltage;

means for adding said periodic signal to said power supply voltage to produce a first signal;

means for distributing said first signal to said plurality of local circuits, said means for distributing comprising a first node for receiving said first signal and a plurality of output nodes coupled to the local circuits; and means associated with each of the plurality of local circuits for deriving a local clock signal from said first signal;

wherein said means for distributing displays a propagation delay between said first node and any of said output nodes which is less than a first percentage of the period of said local clock signals, whereby a clock skew exhibited by said integrated circuit is kept below said first percentage.

13. The apparatus of claim 12, wherein said first percentage is less than 10 percent.

14. The apparatus of claim 13, wherein said first percentage is less than 1 percent.

15. The apparatus of claim 13, said power supply voltage being a positive rail voltage Vdd.

16. The apparatus of claim 13, said power supply voltage being a ground voltage GND.

17. A method for providing clock signals to a plurality of local circuits in an integrated circuit, comprising the steps of:

adding a periodic signal to a power supply voltage of said integrated circuit to produce a power-plus-clock signal;

distributing the power-plus-clock signal to the plurality of local circuits; and for each local circuit, extracting a clock signal from the power-plus-clock signal.

* * * * *